(12) United States Patent
Kim et al.

(10) Patent No.: US 11,991,826 B2
(45) Date of Patent: May 21, 2024

(54) FLEXIBLE PRINTED CIRCUIT BOARD

(71) Applicant: DONGWOO FINE-CHEM CO., LTD., Iksan-si (KR)

(72) Inventors: Jongmin Kim, Pyeongtaek-si (KR); Dong Pil Park, Incheon (KR); Yoonho Huh, Seoul (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 322 days.

(21) Appl. No.: 17/602,527

(22) PCT Filed: Apr. 10, 2020

(86) PCT No.: PCT/KR2020/004943
§ 371 (c)(1),
(2) Date: Oct. 8, 2021

(87) PCT Pub. No.: WO2020/209689
PCT Pub. Date: Oct. 15, 2020

(65) Prior Publication Data
US 2022/0174819 A1 Jun. 2, 2022

(30) Foreign Application Priority Data
Apr. 12, 2019 (KR) .................... 10-2019-0043150

(51) Int. Cl.
*H05K 1/11* (2006.01)
*H01Q 1/24* (2006.01)
(Continued)

(52) U.S. Cl.
CPC ............ *H05K 1/118* (2013.01); *H01Q 1/38* (2013.01); *H05K 1/0218* (2013.01); *H05K 1/189* (2013.01);
(Continued)

(58) Field of Classification Search
CPC ...... H05K 1/02; H05K 1/0203; H05K 1/0218; H05K 1/028; H05K 1/0243; H05K 1/0263;
(Continued)

(56) References Cited

U.S. PATENT DOCUMENTS 5,608,192 A * 3/1997 Moriizumi .......... H01L 23/5386
174/262
6,377,408 B1 * 4/2002 Shinohara ................ G02B 7/04
359/694
(Continued)

FOREIGN PATENT DOCUMENTS

JP    2004-228344 A    8/2004
KR    10-0633062 B1    10/2006
(Continued)

OTHER PUBLICATIONS

International Search Report for PCT/KR2020/004943 dated Jul. 29, 2020 (PCT/ISA/210).

*Primary Examiner* — Xiaoliang Chen
(74) *Attorney, Agent, or Firm* — Sughrue Mion, PLLC

(57) ABSTRACT

A flexible printed circuit board includes a power wiring layer transmitting power and a signal wiring layer insulated and stacked over or under the power wiring layer. The flexible printed circuit board may also include an upper wiring layer and a lower wiring layer insulated and stacked each other, and the power wiring layer and the signal wiring layer are provided between the upper wiring layer and the lower wiring layer.

12 Claims, 3 Drawing Sheets

(51) Int. Cl.
*H01Q 1/38* (2006.01)
*H01Q 1/48* (2006.01)
*H05K 1/02* (2006.01)
*H05K 1/16* (2006.01)
*H05K 1/18* (2006.01)
*H05K 3/00* (2006.01)
*H05K 3/28* (2006.01)
*H05K 3/36* (2006.01)
*H05K 3/40* (2006.01)

(52) U.S. Cl.
CPC ... *H05K 3/281* (2013.01); *H05K 2201/09327* (2013.01)

(58) Field of Classification Search
CPC .. H05K 1/0271; H05K 1/0274; H05K 1/0298; H05K 1/036; H05K 1/0393; H05K 1/11; H05K 1/16; H05K 1/115; H05K 1/118; H05K 1/147; H05K 1/189; H05K 3/0011; H05K 3/36; H05K 3/40; H05K 3/281; H05K 3/387; H05K 3/427; H05K 3/4688; H05K 3/4691; H05K 2201/0715; H05K 2201/09027; H05K 2201/09327; H05K 2201/09981; H05K 2201/10098; H05K 2201/10128; H05K 2201/10136; H05K 2201/10166; H05K 2201/10189; H05K 1/117; H05K 3/00; H05K 3/11; H01Q 1/24; H01Q 1/38; H01Q 1/48; H01Q 1/243; H01Q 1/245; H01Q 1/2283; H01Q 1/2291
USPC ........ 361/749, 600, 750, 792; 174/254, 255, 174/262, 117 F, 260; 428/209, 213, 214, 428/220
See application file for complete search history.

(56) References Cited

U.S. PATENT DOCUMENTS

| | | | |
|---|---|---|---|
| 10,218,396 B2* | 2/2019 | Son | H01Q 9/145 |
| 10,616,995 B2* | 4/2020 | Kim | H01R 12/50 |
| 2004/0142155 A1* | 7/2004 | Yokota | H05K 1/036 |
| | | | 428/209 |
| 2004/0174663 A1* | 9/2004 | Itokawa | H05K 1/147 |
| | | | 361/600 |
| 2012/0009399 A1* | 1/2012 | Nonaka | B32B 15/20 |
| | | | 156/60 |
| 2012/0098091 A1* | 4/2012 | Ikemoto | H01L 23/50 |
| | | | 257/532 |
| 2012/0132458 A1* | 5/2012 | Sekine | H05K 1/0393 |
| | | | 174/254 |
| 2012/0260501 A1* | 10/2012 | Li | H05K 3/4691 |
| | | | 29/846 |
| 2014/0178069 A1* | 6/2014 | Kim | H04J 14/0221 |
| | | | 398/49 |
| 2016/0178839 A1* | 6/2016 | Tsujita | H05K 1/028 |
| | | | 385/14 |
| 2016/0365660 A1* | 12/2016 | Annis | H05K 1/189 |
| 2018/0212473 A1* | 7/2018 | Kim | H04B 1/3883 |
| 2018/0213637 A1* | 7/2018 | Hosoda | B32B 27/288 |
| 2018/0302981 A1* | 10/2018 | Ranganathan | H05K 1/142 |
| 2018/0307369 A1* | 10/2018 | Park | H05K 1/189 |
| 2018/0323496 A1* | 11/2018 | Lee | H01Q 1/245 |
| 2019/0104212 A1* | 4/2019 | Lee | H01Q 9/0435 |
| 2020/0014090 A1* | 1/2020 | Jung | H01Q 1/38 |

FOREIGN PATENT DOCUMENTS

| | | |
|---|---|---|
| KR | 10-2012-0092365 A | 8/2012 |
| KR | 10-1168900 B1 | 8/2012 |
| KR | 10-2014-0069571 A | 6/2014 |
| KR | 10-1427131 B1 | 8/2014 |
| KR | 10-2015-0090697 A | 8/2015 |
| KR | 10-2015-0131922 A | 11/2015 |

* cited by examiner

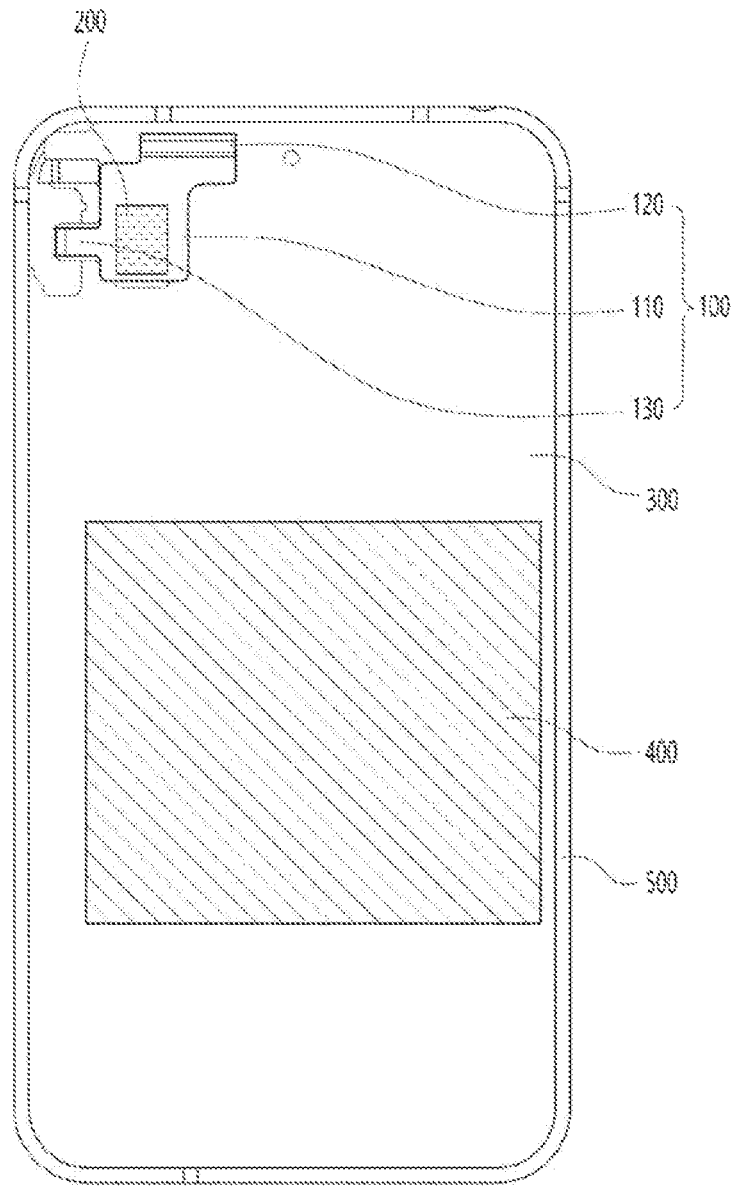

[Figure 2]
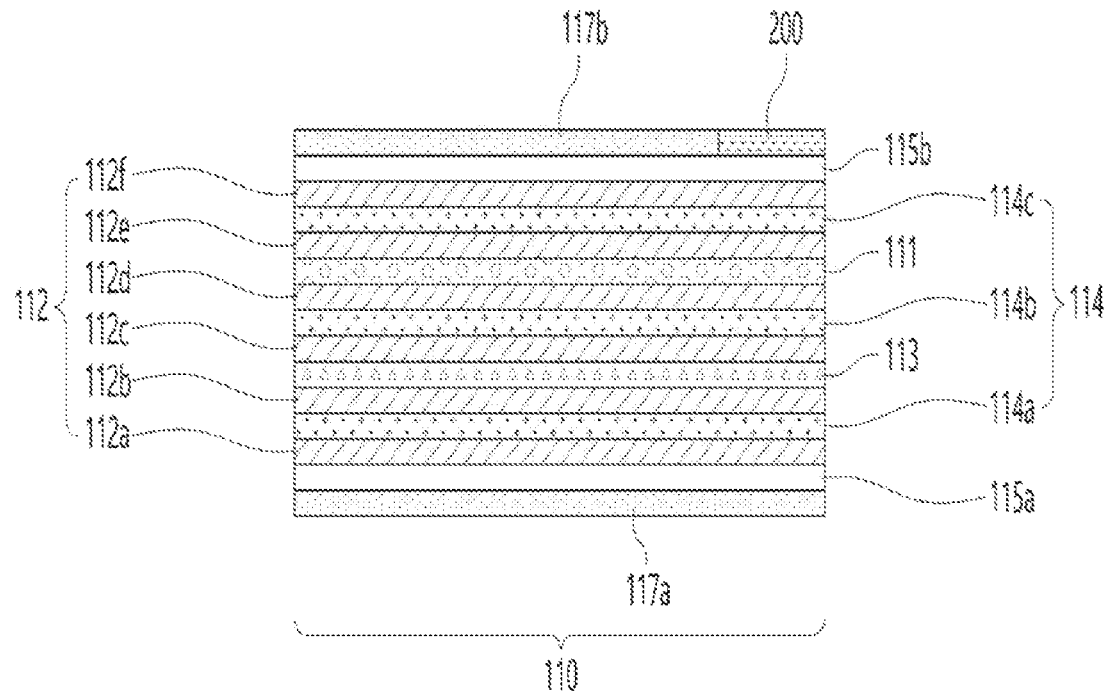
[Figure 3]
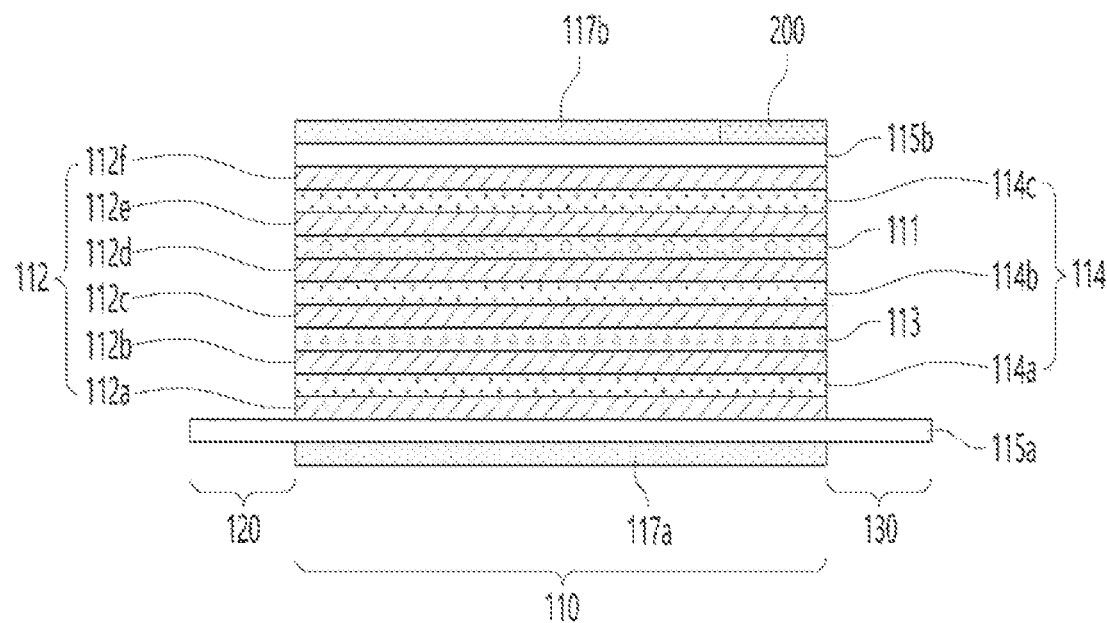

[Figure 4]
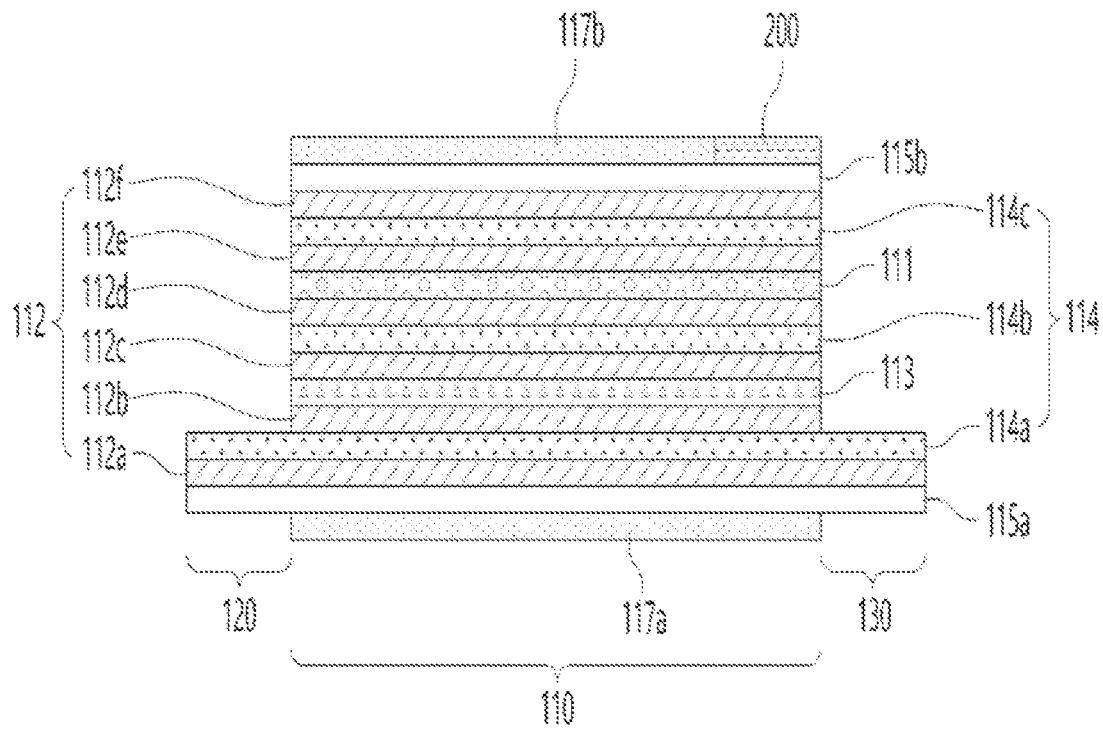
[Figure 5]
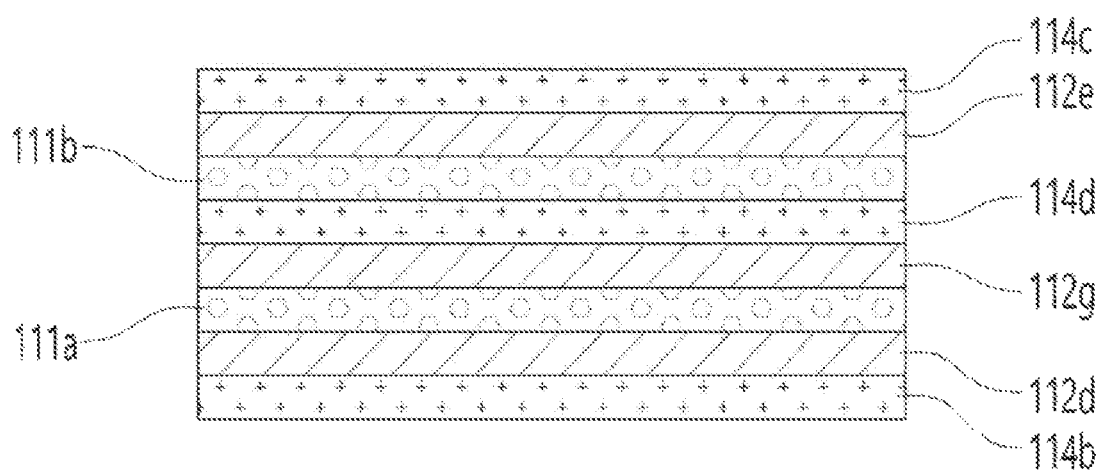

FLEXIBLE PRINTED CIRCUIT BOARD

CROSS REFERENCE TO RELATED APPLICATIONS

This is a National Stage of International Application No. PCT/KR2020/004943 filed Apr. 10, 2020, claiming priority based on Korean Patent Application No. 10-2019-0043150 filed Apr. 12, 2019, the contents of all of which are incorporated herein by reference in their entirety.

TECHNICAL FIELD

The present invention relates to a flexible printed circuit board (FPCB). Particularly, the present invention relates to an FPCB capable of minimizing line loss and signal interference in high frequency or ultra-high frequency communication environment.

BACKGROUND ART

Information processing devices such as smartphones, PDAs, and tablets receive texts, graphics, and the like using various input devices such as keyboards and mice.

Due to the rapid progress of the information society, the use of information processing devices is expanding. In line with this trend, there is a limit to meeting the needs of users with the existing keyboard and mouse that take charge of input. As a result, there is a growing demand for an input device that is easy to use and has fewer erroneous operations.

A touch panel may be installed on a display surface of a display device such as an electronic organizer, LCD (Liquid Crystal Display Device), PDP (Plasma Display Panel), EL (Electroluminescence), etc. to select and input information displayed on the display surface.

Korean Patent Application Publication No. 2012-0092365 discloses a touch panel. The disclosed touch panel includes a substrate, an electrode formed on the substrate, and wiring extending from the electrode and gathered to one end of the substrate, and the wiring is connected to a main PCB through an FPCB.

Korean Patent Application Publication No. 2015-0090697 discloses an FPCB and a touch sensor module including the same. In the structure of the disclosed FPCB, the step difference between the FPCB and an electronic device is removed at the connection part, thereby increasing the connection reliability of the touch sensor.

As described above, the conventional FPCB has a structure in which a power wiring layer and a signal wiring layer for transmitting power and signals, respectively, are formed in one layer, and cover layers are formed on the upper and lower parts to protect the upper and lower wiring layers.

However, when a conventional FPCB having such a structure is used in a high frequency or ultra-high frequency communication environment, noise and transmission loss may increase in a transmission line due to a short wavelength of a signal. This increase in noise and loss can be noticeable when transmitting and receiving power and signals between the FPCB and an antenna.

DISCLOSURE OF INVENTION

Technical Problem

The present invention is to solve problems occurring when using an FPCB in a high frequency or ultra-high frequency communication environment.

Accordingly, it is an object of the present invention to provide an FPCB capable of minimizing the loss and noise generated in the process of transmitting power and signals through the FPCB.

It is another object of the present invention to provide an FPCB capable of maximizing flexibility when connecting the FPCB to an antenna or main PCB.

It is yet another object of the present invention to provide an FPCB capable of further reducing the transmission loss by minimizing the transmission distance between the IC chip and the antenna.

Technical Solution

An FPCB of the present invention for achieving this purpose includes an upper wiring layer, a lower wiring layer insulated and stacked under the upper wiring layer, and a power and signal wiring layer insulated and stacked between the upper wiring layer and the lower wiring layer to transmit power and signals. The power and signal wiring layer may include a power wiring layer configured to transmit power, and a signal wiring layer insulated and stacked over or under the power wiring layer.

The FPCB of the present invention may include a first and a second connection parts. The first connection part may protrude and extend from one side of the lower wiring layer, and the second connection part protrude and extend from the other side of the lower wiring layer.

In the FPCB of the present invention, the first connection part is an antenna connection part connected to an antenna part, and the second connection part is a main PCB connection part connected to a main PCB.

The FPCB of the present invention may further include an insulating base film on the lower wiring layer.

The FPCB of the present invention may further include a ground layer on the insulating base film.

The FPCB of the present invention may configure a thickness of a laminate of the lower wiring layer, the insulating base film, and the ground layer to be 20 to 250 μm.

In the FPCB of the present invention, the power wiring layer may include an AC power wiring layer, and a DC power wiring layer insulated and stacked over or under the AC power wiring layer.

In the FPCB of the present invention, the power wiring layer may include AC power wiring and DC power wiring in the same layer.

The FPCB of the present invention may include an IC chip surface-mounted on the upper wiring layer.

The FPCB of the present invention may include a plurality of ground layers insulated and stacked between respective layers of the upper wiring layer, the power wiring layer, the signal wiring layer, and the lower wiring layer.

The FPCB of the present invention may include an upper cover layer coupled over the upper wiring layer, and a lower cover layer coupled under the lower wiring layer.

The FPCB of the present invention may include an upper EMI shielding layer coupled over the upper cover layer, and a lower EMI shielding layer coupled under the lower cover layer.

The FPCB of the present invention may include a position-fixing insulating tape coupled over the upper cover layer or the upper EMI shielding layer.

Advantageous Effects

According to the FPCB of the present invention having such a configuration, loss and noise generated in the process of transmitting power and signals through the FPCB can be minimized by separating a power wiring layer transmitting power and a signal wiring laver transmitting signals vertically and shielding them with a ground layer.

According to the FPCB of the present invention, it is possible to maximize the flexibility of the FPCB by minimizing the thickness of connection parts with an antenna connection part and a main PCB connection part protruded and extended from the side ends of a lower wiring layer, and as a result, the FPCB can be easily connected to an antenna and a main PCB.

In addition, according to the FPCB of the present invention, by surface-mounting an IC chip on top of the FPCB, the transmission distance between the IC chip and the antenna can be minimized, and as a result, loss and noise generated when transmitting power and signals can be further reduced.

DESCRIPTION OF DRAWINGS

FIG. 1 shows a rear structure of a portable terminal equipped with an FPCB according to the present invention.

FIG. 2 is a cross-sectional view showing the first embodiment of an FPCB according to the present invention.

FIG. 3 is a cross-sectional view showing the second embodiment of an FPCB according to the present invention.

FIG. 4 is a cross-sectional view showing the third embodiment of an FPCB according to the present invention.

FIG. 5 is a cross-sectional view showing a power wiring layer of an FPCB according to the present invention.

BEST MODE

The present invention is, hereinafter, described in more detail with reference to the accompanying drawings. However, the following drawings attached to the present specification illustrate preferred embodiments of the present invention, and serve to further understand the technical spirit of the present invention together with the above-described content of the present invention. Therefore, the present invention should not be construed as being limited only to the matters described in such drawings.

FIG. 1 shows a rear structure of a portable terminal equipped with an FPCB according to the present invention.

As shown in FIG. 1, the portable terminal may include the FPCB 100, an IC chip 200, a main PCB 300, a battery 400, a rear case 500, and so on.

The FPCB 100 transmits or processes a signal between the main PCB 300 and a touch sensor (not shown) or between the main PCB 300 and an antenna part (not shown), and it may be fixed to one side of the main PCB 300 with an insulating adhesive tape or the like.

The FPCB 100 may include an FPCB body 110, an antenna connection part 120, a PCB connection part 130, and the like.

In the FPCB body 110, a power wiring layer transmitting power and a signal wiring layer transmitting a signal may be vertically separated and stacked. The power wiring layer and the signal wiring layer may be insulated by inserting an insulating base film such as a polyimide (PI) film between them in the FPCB body 110. The power wiring layer and the signal wiring layer may be shielded by inserting a ground layer of a conductive metal between the power wiring layer and the signal wiring layer in the FPCB body 110. The FPCB body 110 can be easily bent by forming the insulating base film of a flexible material and forming the power wiring layer, signal wiring layer, ground layer, and the like as thin films.

The antenna connection part 120 may be configured by extending a part of the FPCB body 110 from one side thereof. The antenna connection part 120 may include an antenna connection pad and may be coupled to the antenna part (not shown) through an adhesive film such as ACF.

The PCB connection part 130 may be configured by extending a part of the FPCB body 110 from the other side thereof. The PCB connection part 130 may include a PCB connection pad and may be coupled to the main PCB 300 through an adhesive film such as ACF.

In this way, the FPCB 100 separates and shields the power wiring layer and the signal wiring layer vertically, thereby minimizing signal loss and signal interference even in a high frequency band, for example, 28 GHz, which is a 5G frequency band.

The IC chip 200 processes a signal or outputs a control command, and may be surface-mounted on the FPCB body 110 using a Surface Mounting Technology (SMT) method. The transmission distance between the IC chip 200 and the antenna part can be minimized by mounting the IC chip 200 on top of the FPCB 100. Through this, signal loss and signal interference occurring in transmission between the IC chip 200 and the antenna part may be minimized.

The main PCB 300 supplies power to an antenna or the like through the FPCB 100 and transmits and receives signals, and may be coupled and fixed in the rear case 500. The main PCB 300 may include a socket for inserting and mounting a memory card, an interface connector, a battery terminal, and the like.

The battery 400 may be coupled to the main PCB 300. The battery 400 may supply power to the antenna or the like through the main PCB 300 and the FPCB 100.

The rear case 500 protects the mobile terminal from external impact, and may be configured in a shape that is opened front and rear to surround the rim. The rear case 500 may be configured as an integral body or may be configured as a plurality of bumper frames to be coupled at the front and rear sides of the rim of the mobile terminal. The bumper frames may be coupled by fitting coupling protrusions and coupling grooves. The rear case 500 may be made of metal, silicone, plastic, or the like.

The antenna part transmits and receives signals wirelessly, and may be provided on the main PCB 300, the rear case, or the like. The antenna part may include a pattern layer, a connection pad, and the like. The pattern layer may be in the form of a patch antenna or an arrangement thereof, and a low-resistance metal such as silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), or an alloy thereof, or a transparent conductive oxide such as indium tin oxide (ITO) or indium zinc oxide (IZO) can be used therefor. The connection pad is configured in the form of a pad and may be coupled to the antenna connection part 120 of the FPCB 100. The connection pad may use a material substantially the same as or similar to that of the above-described pattern layer.

FIG. 2 is a cross-sectional view showing the first embodiment of an FPCB according to the present invention.

As shown in FIG. 2, in the FPCB 100 according to the present invention, an FPCB body 110 may be stacked by vertically separating a power wiring laver 111 and a signal wiring layer 113.

The power wiring layer 111 transmits power from a battery 400 to an IC chip 200 and an antenna part, and may be formed by patterning a conductive metal film.

The signal wiring layer 113 transmits a signal between a main PCB 300, the IC chip 200, and the antenna part, and may be formed by patterning a conductive metal film.

The power wiring layer 111 may be insulated and supported by an insulating base film 112e.

The signal wiring layer 113 may be insulated and supported by an insulating base film 112c.

Signal interference may be shielded from the power wiring layer 111 and the signal wiring layer 113 by a ground layer 114b. The ground layer 114b may be formed from a conductive metal film made of a low-resistance metal such as, for example, silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), or an alloy thereof. The ground layer 114b is insulated and supported by an insulating base film 112d, and it is insulated from the power wiring layer 111 by the insulating base film 112d and from the signal wiring layer 113 by the insulating base film 112c.

A lower wiring layer 115a is connected to the main PCB 300, the antenna part, etc. to transmit and receive power and signals, and may be disposed under the signal wiring layer 113. The lower wiring layer 115a may be formed by patterning a conductive metal layer.

The lower wiring layer 115a may be insulated and supported by an insulating base film 112a.

The lower wiring layer 115a may be shielded from the signal wiring layer 113 above by a ground layer 114a.

The ground layer 114a is insulated and supported by an insulating base film 112b, and it is insulated from the lower wiring layer 115a by the insulating base film 112a and from the signal wiring layer 113 by the insulating base film 112b.

An upper wiring layer 115b connects the FPCB body 110 and the IC chip 200 to transmit and receive power and signals between them, and may be disposed over the power wiring layer 11. The upper wiring layer 115b may be formed by patterning a conductive metal layer.

The upper wiring layer 115b may be insulated by an insulating base film 112f.

The upper wiring layer 115b may be shielded from the power wiring layer 111 by a ground layer 114c.

The ground layer 114c may be insulated from the power wiring layer 111 by the insulating base film 112e and from the upper wiring layer 115b by the insulating base film 112f.

The insulating base films 112 may include via holes penetrating vertically therein. The via holes can transmit power and signals between the lower wiring layer 115a, the signal wiring layer 113, the power wiring layer 111, and the upper wiring layer 115b.

For the insulating base films 112, materials having both insulation characteristics and flexibility, for example, polyimide (PI), liquid crystal polymer (LCP), etc. may be used.

The IC chip 200 may be surface-mounted on the upper wiring layer 115b as shown in FIG. 2.

A lower cover layer 117a may be coupled to the exposed surface of the lower wiring layer 115a, that is, the lower surface thereof to protect the exposed surface of the lower wiring layer 115a. As the lower cover layer 117a, an insulating film in which a thermosetting flame-retardant epoxy adhesive is coated on a polyimide film may be used.

An upper cover layer 117b may be coupled to the exposed surface of the upper wiring layer 115b, that is, the upper surface thereof to protect the exposed surface of the upper wiring layer 115b. The upper cover layer 117b may be coupled to the exposed surface of the upper wiring layer 115b except for the IC chip 200. As the upper cover layer 117b, an insulating film in which a thermosetting flame-retardant epoxy adhesive is coated on a polyimide film may be used.

Although not shown in FIG. 2, a lower EMI (Electro Magnetic Interference) shielding layer and an upper EMI shielding layer having electromagnetic wave shielding functions may be respectively formed under the lower cover layer 117a and over the upper cover layer 117b.

The lower/upper EMI shielding layer may be a film in which a metal layer and a conductive adhesive layer are laminated.

In FIG. 2, the power wiring layer 111 is disposed over the signal wiring layer 113, but the power wiring layer 111 may be disposed under the signal wiring layer 113.

The FPCB 100 according to the present invention may be fixed to the main PCB 300 with a position-fixing insulating tape or the like.

FIG. 3 is a cross-sectional view showing the second embodiment of an FPCB according to the present invention.

As shown in FIG. 3, the FPCB 100 of the second embodiment may include an antenna connection part 120 and a main PCB connection part 130 protruding laterally.

The antenna connection part 120 protrudes from one side of an FPCB body 110, and may include an extended part on one side of a lower wiring layer 115a and an antenna connection pad. The antenna connection pad may be coupled to an antenna part.

The main PCB connection part 130 may be formed to protrude from the other side of the FPCB body 110, that is, from the opposite side of the antenna connection part 120. The main PCB connection part 130 may include an extended part on the other side of the lower wiring layer 115a and a PCB connection pad. The PCB connection pad may be connected to a main PCB 300.

As shown in FIG. 3, when the antenna connection part 120 and the main PCB connection part 130 are configured only with the extended parts of the lower wiring layer 115a, the flexibility of the antenna connection part 120 and the main PCB connection part 130 can be maximized.

Since the remaining configurations of the second embodiment are the same as those of the first embodiment, detailed descriptions of the remaining configurations are replaced with related descriptions of the first embodiment.

FIG. 4 is a cross-sectional view showing the third embodiment of an FPCB according to the present invention.

As shown in FIG. 4, an antenna connection part 120 protrudes and extends from one side of an FPCB body 110, and it may include a ground layer 114a coupled over a lower wiring layer 115a in the extended part. In the extended part, the ground layer 114a may be insulated from the lateral extended part of a lower wiring layer 115a by an insulating base film 112a. The ground layer 114a may shield between the lower wiring layer 115a and the signal wiring layer 113.

The antenna connection part 120 may have a thickness of 20 to 250 μm to have flexibility, and preferably 25 to 150 μm. For example, the antenna connection part 120 may include an 8 μm-thick copper foil-lower wiring layer 115a, an insulating base film 112a, which is a 12 μm-thick PI film, and an 8 μm-thick copper foil-ground layer 114a. When the thickness of the antenna connection part 120 is less than 20 μm, the thickness of the lower wiring layer 115a should be reduced to less than 8 μm, in which case, the resistance of the lower wiring layer 115a may increase to cause the conductivity reduction. When the thickness of the antenna connection part 120 exceeds 250 μm, the flexibility of the antenna connection part 120 may be reduced.

The main PCB connection part 130 protrudes and extends from the other side of the FPCB body 110, that is, from the opposite side of the antenna connection part 120, and in the extended part, it may include the ground layer 114a coupled over the lower wiring layer 115a. In the extended part, the ground layer 114a may be insulated from the other lateral extended part of the lower wiring layer 115a by the insulating base film 112a. The ground layer 114a may shield between the lower wiring layer 115a and the signal wiring layer 113.

The main PCB connection part 130 may have a thickness of 20 to 250 μm to have flexibility, and preferably 25 to 150 μm.

In FIG. 4, the antenna connection part 120 and the main PCB connection part 130 may include the insulating base film 112a on the lower wiring layer 115a, but not the ground layer 114a thereon. In this case, the base film 112b may not be included.

Since the remaining configurations of the third embodiment are the same as those of the first embodiment, detailed descriptions of the remaining configurations are replaced with related descriptions of the first embodiment.

FIG. 5 is a cross-sectional view showing a power wiring layer of an FPCB according to the present invention.

As shown in FIG. 5, in the FPCB of the present invention, a power wiring layer 111 may be stacked by vertically separating an AC power wiring layer 111a and a DC power wiring layer 111b. The stacking order of the AC power wiring layer 111a and the DC power wiring layer 111b may be changed.

The AC power wiring layer 111a and the DC power wiring layer 111b may be insulated by an insulating base film 112g and may be shielded by a ground layer 114d.

As in FIG. 5, when the power wiring layer 111 is vertically separated into the AC power wiring layer 111a and the DC power wiring layer 111b and stacked, it is possible to flexibly respond to the arrangement requirements of the circuit design, such as when it is difficult to arrange the converter parts.

In FIG. 5, the power wiring layer 111 is illustrated and described in which the AC power wiring layer 111a and the DC power wiring layer 111b are vertically separated, but it is not excluded to have AC power wiring and DC power wiring of the power wiring layer 111 in one layer, that is, in the same layer.

Although particular embodiments of the present invention have been shown and described, it will be understood by those skilled in the art that it is not intended to limit the present invention to the preferred embodiments, and it will be obvious to those skilled in the art that various changes and modifications may be made without departing from the spirit and scope of the invention.

The scope of the present invention, therefore, is to be defined by the appended claims and equivalents thereof.

[Decription of reference numerals]

100: FPCB
110: FPCB body
111: power wiring layer
112: base film
113: signal wiring layer
114: ground layer
115a, 115b: lower/upper wiring layer
117a, 117b: lower/upper cover layer
120: antenna connection part
130: main PCB connection part -continued

[Decription of reference numerals]

200: IC chip
300: main PCB
400: battery
500: rear case

The invention claimed is:

1. A flexible printed circuit board, comprising:
an upper wiring layer;
a lower wiring layer insulated and stacked under the upper wiring layer;
a first connection part protruding and extending from one side of the lower wiring layer;
a second connection part protruding and extending from the other side of the lower wiring layer;
a power and signal wiring layer insulated and stacked between the upper wiring layer and the lower wiring layer to transmit power and signals, wherein
the power and signal wiring layer includes
a power wiring layer configured to transmit power; and
a signal wiring layer insulated and stacked over or under the power wiring layer, and
a plurality of ground layers insulated and stacked between respective layers of the upper wiring layer, the power wiring layer, the signal wiring layer, and the lower wiring layer.

2. The flexible printed circuit board of claim 1, wherein:
the first connection part is an antenna connection part connected to an antenna part; and
the second connection part is a main PCB connection part connected to a main PCB.

3. The flexible printed circuit board of claim 1, further comprising an insulating base film on the lower wiring layer.

4. The flexible printed circuit board of claim 3, further comprising a ground layer on the insulating base film.

5. The flexible printed circuit board of claim 4, wherein a laminate of the lower wiring layer, the insulating base film, and the ground layer has a thickness of 20 to 250 μm.

6. The flexible printed circuit board of claim 1, wherein the power wiring layer includes:
an AC power wiring layer; and
a DC power wiring layer insulated and stacked over or under the AC power wiring layer.

7. The flexible printed circuit board of claim 1, wherein the power wiring layer includes AC power wiring and DC power wiring in the same layer.

8. The flexible printed circuit board of claim 1, further comprising an IC chip surface-mounted on the upper wiring layer.

9. The flexible printed circuit board of claim 1, further comprising:
an upper cover layer coupled over the upper wiring layer; and
a lower cover layer coupled under the lower wiring layer.

10. The flexible printed circuit board of claim 9, further comprising:
an upper EMI shielding layer coupled over the upper cover layer; and
a lower EMI shielding layer coupled under the lower cover layer.

11. The flexible printed circuit board of claim 9, further comprising a position-fixing insulating tape coupled over the upper cover layer.

12. The flexible printed circuit board of claim 10, further comprising a position-fixing insulating tape coupled over the upper cover layer or the upper EMI shielding layer.

\* \* \* \* \*